(12) United States Patent (10) Patent No.: US 12,622,287 B2
Kamgaing (45) Date of Patent: May 5, 2026

(54) MULTILAYER GLASS SUBSTRATE

(71) Applicant: Intel Corporation, Santa Clara, CA
(US)

(72) Inventor: Telesphor Kamgaing, Chandler, AZ
(US)

(73) Assignee: Intel Corporation, Santa Clara, CA
(US)

( * ) Notice: Subject to any disclaimer, the term of this
patent is extended or adjusted under 35
U.S.C. 154(b) by 343 days.

(21) Appl. No.: 17/557,585

(22) Filed: Dec. 21, 2021

(65) Prior Publication Data

US 2023/0197618 A1 Jun. 22, 2023

(51) Int. Cl.
H01L 23/538 (2006.01)
H01L 23/00 (2006.01)
H01L 23/29 (2006.01)
(52) U.S. Cl.
CPC ........ H01L 23/5383 (2013.01); H01L 23/291
(2013.01); H01L 24/05 (2013.01); *H01L*
*2224/05008* (2013.01); *H01L 2224/05188*
(2013.01)
(58) Field of Classification Search
CPC .... H01L 23/5383; H01L 23/291; H01L 24/05
See application file for complete search history.

(56) References Cited

U.S. PATENT DOCUMENTS

| | | | | |
|---|---|---|---|---|
| 2001/0051426 A1* | 12/2001 | Pozder | .................... | H01L 24/05 |
| | | | | 257/E21.582 |
| 2011/0084403 A1* | 4/2011 | Yang | ....................... | H01L 25/50 |
| | | | | 257/777 |
| 2015/0021789 A1* | 1/2015 | Lin | ..................... | H01L 25/0657 |
| | | | | 438/118 |
| 2020/0126906 A1* | 4/2020 | Uzoh | ............... | H01L 21/76829 |

* cited by examiner

*Primary Examiner* — Dale E Page
*Assistant Examiner* — Wilner Jean Baptiste
(74) *Attorney, Agent, or Firm* — Schwabe, Williamson &
Wyatt, P.C.

(57) ABSTRACT

Embodiments herein relate to systems, apparatuses, techniques, or processes for packages that include multiple glass layers within the package. In embodiments, a core of the package may include multiple glass layers that may be bonded together, or may be separated by a dielectric layer between glass layers. In embodiments, the glass layers may include one or more electrically conductive features, such as conductive vias, conductive planes, electrical pads, electrical traces, redistribution layer, capacitors, inductors, active dies and/or passive dies. Other embodiments may be described and/or claimed.

20 Claims, 7 Drawing Sheets

MULTILAYER GLASS SUBSTRATE

FIELD

Embodiments of the present disclosure generally relate to the field of package assemblies, and in particular package assemblies with multiple core layers.

BACKGROUND

Continued reduction in computing package sizes of mobile electronic devices such as smart phones and ultrabooks is a driving force behind increased yield and quality of semiconductor packages.

DETAILED DESCRIPTION

Figure 1:
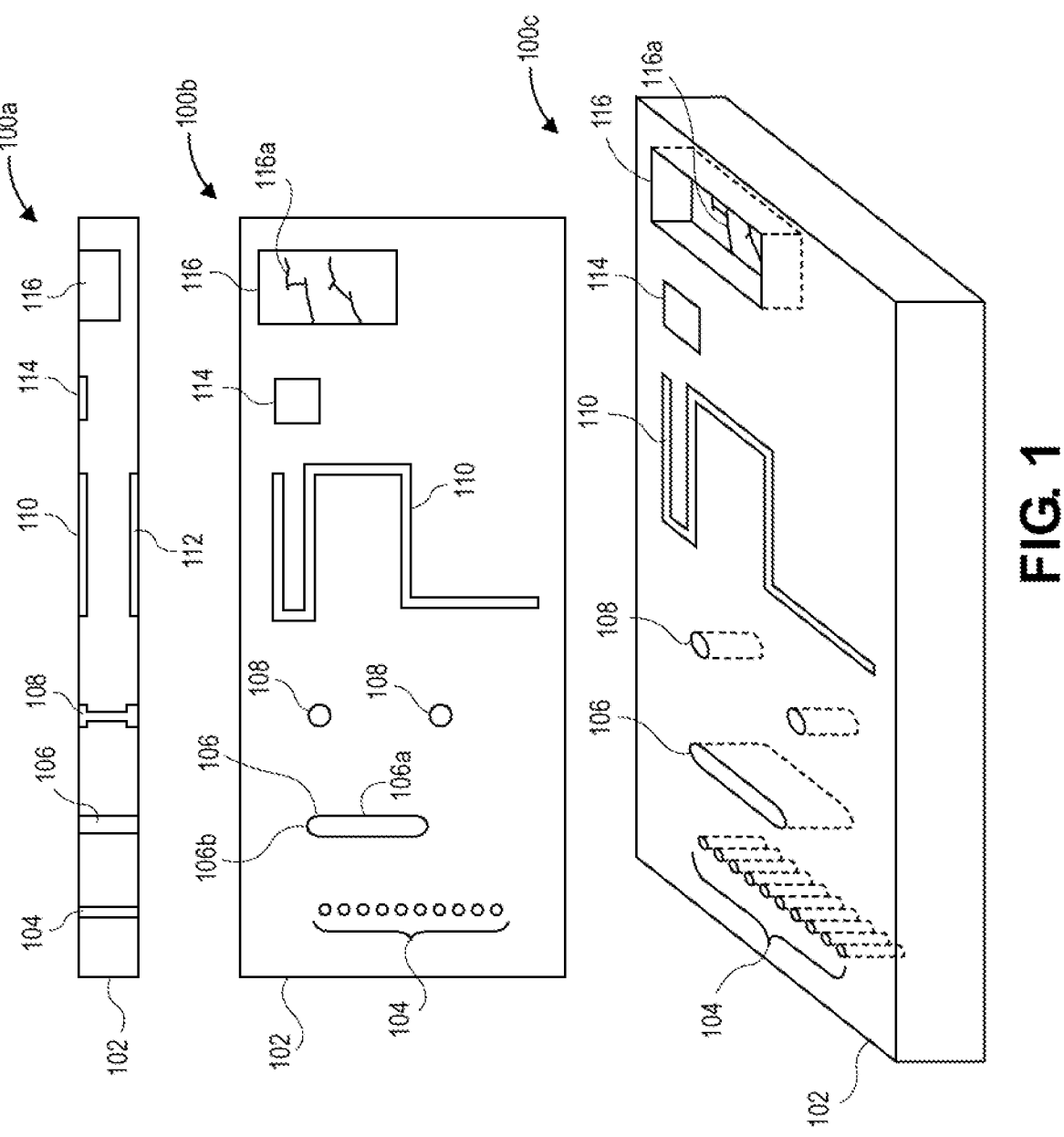
FIG. 1 shows a cross section side view, a top-down view, and a perspective view of a glass layer that includes a plurality of electrically conductive features, in accordance with various embodiments.

Embodiments of the present disclosure may generally relate to systems, apparatus, techniques, and/or processes directed to a package that include multiple glass layers within the package. In embodiments, a core of the package may include multiple glass layers that may be bonded together. In other embodiments, one or more of the multiple glass layers may be separated by a non-glass layer, such as a dielectric layer. In embodiments, the glass layers may include one or more electrically conductive features, such as conductive vias, conductive planes, electrical pads, electrical traces, redistribution layers, capacitors, inductors, active dies and/or passive dies. In embodiments, a glass layer may include one or more through glass vias, and/or blind vias that are etched into the glass using techniques described below.

Legacy microelectronic packaging is dominated by multilayer organic packaging substrates within a package. Such substrates include multiple layers, which may be referred to as a stack, within one or more core layers. Signal communication within a package or between packages usually requires a path through the one or more core layers. In legacy implementations, a copper cladded laminate (CCL) core is used. While useful to improve substrate warpage, CCL implementations do not allow narrow drilling for high density plated through holes (PTH) to support high-bandwidth communication. Similarly, in legacy implementations it is difficult to integrate components within the CCL core or to fabricate packages with multilayer CCL core layers.

Embodiments of packages that include multiple glass layers may include ultra-thin conductive traces within a core stack. Embodiments may also include integrated components such as inductors, capacitors, and the like between the glass layers or within the glass layers within the core stack. Embodiments that use multiple glass layers may improve the rigidity of the package and reduce warpage of the package stack up in contrast to legacy packages that use CCL layers.

In embodiments, using multiple glass layers within packages may also lead to increased performance versus legacy CCL core implementations. Techniques used to create narrow and/or high aspect ratio through glass vias (TGV), as well as to create trenches of various steps and sizes within glass, which may be referred to as blind vias, are described herein. These techniques may be used to fabricate packages and/or package cores that include multiple glass layers. These techniques may include laser-assisted glass etching allowing crack free, high-density via drills to be formed into a glass substrate. Different process parameters can be adjusted to achieve drills of various shapes and depths within glass. In embodiments, the results of these drills may be filled in with material other than a metal material like copper. It should be noted that glass layers may be processed by wafer, by panel, or by sub panel.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIG. 1 shows a cross section side view, a top-down view, and a perspective view of a glass layer that includes a plurality of electrically conductive features, in accordance with various embodiments. Diagram 100a shows a cross section side view of a glass layer 102. In embodiments, the glass layer 102 may include multiple structures for example through vias 104, plane 106, plated through vias 108 that include pads, electrical routings 110, 112, pads 114, and cavity 116. In embodiments, each of these structures may be formed using the techniques described below with respect to FIG. 5. In embodiments, the through vias 104 and plane 106, may be standalone, metal plated, or metal filled, for example for electrical conductivity or electromagnetic interference (EMI) shielding. In embodiments, the metal may include copper. In embodiments, a thickness of the glass layer 102 may be between 50 μm to 100 μm.

Diagram 100b shows a top-down view of diagram 100a. Through vias 104 are shown as tightly clustered in a linear formation, which may be used, for example, to facilitate high-bandwidth signals between the top and bottom of the glass layer 102. In other embodiments, through vias 104 may be clustered in a rectangular, circular, or some other configuration or shape. In embodiments, through via diameters may be as low as 5 μm and as large as 100 μm.

Plane 106 may have an arbitrary length, for example on the order of 1 mm, and a width that may be as low as 15 μm, for example on a glass layer 102 of a thickness in the 50 μm to 1000 μm range. In embodiments, the plane 106 may have straight edges 106a, or rounded edges 106b. In embodiments, the plane 106 may not be a plane at all (not shown), and may incorporate turns to form, for example, an "S" configuration. In embodiments, a width of the plane 106 may be as small as 5 μm and as large as 100 μm. In addition, plated through vias 108 may be formed of varying widths for, for example, a pad near a side of the glass layer 102 and a portion of the through vias 108 that passes near the center of the glass layer 102. In addition, electrical routing 110 may be formed using a blind via, as discussed further below with respect to FIG. 5, which may be filled with a conductive material such as copper. In embodiments, the electrical routing 110 may also be referred to as an electrical trace. Electrical routing 110 may be used for electrical signals, (including signal, references, and shielding), or for power delivery including Vdd and Vss. For signaling, electrical routing 110 width may range from less than 1 μm to 50 μm, and the thickness of the electrical routing 110 may be less than 1 μm to 30 μm. In embodiments, individual electrical routings 110 may be placed next to each other and may be separated by 1 μm or less. Separations larger than 1 μm may also be used between electrical routings.

In embodiments, pad 114 may include a trench that is etched using the techniques described below with respect to FIG. 5, and subsequently filled with the conductive material such as copper. As discussed further below, the pad 114 may be coupled with a pad on another glass layer (not shown), with a dielectric between each pad to form a capacitor. In embodiments, cavity 116 may be formed into glass layer 102 using techniques described below with respect to FIG. 5. In embodiments, discussed further below, cavity 116 may have a depth, width, and length that is large enough to accommodate a die (not shown) that may be either an active die or a passive die. In embodiments, a routing layer 116a may be formed at the bottom of the cavity 116 in order to electrically couple electrical contact points of a die (not shown) inserted into the cavity 116. In embodiments, the routing layer 116a may also extend up the sides of the cavity 116. Diagram 100c shows a perspective view of glass layer 102 with the various features as described above.

Figure 2:
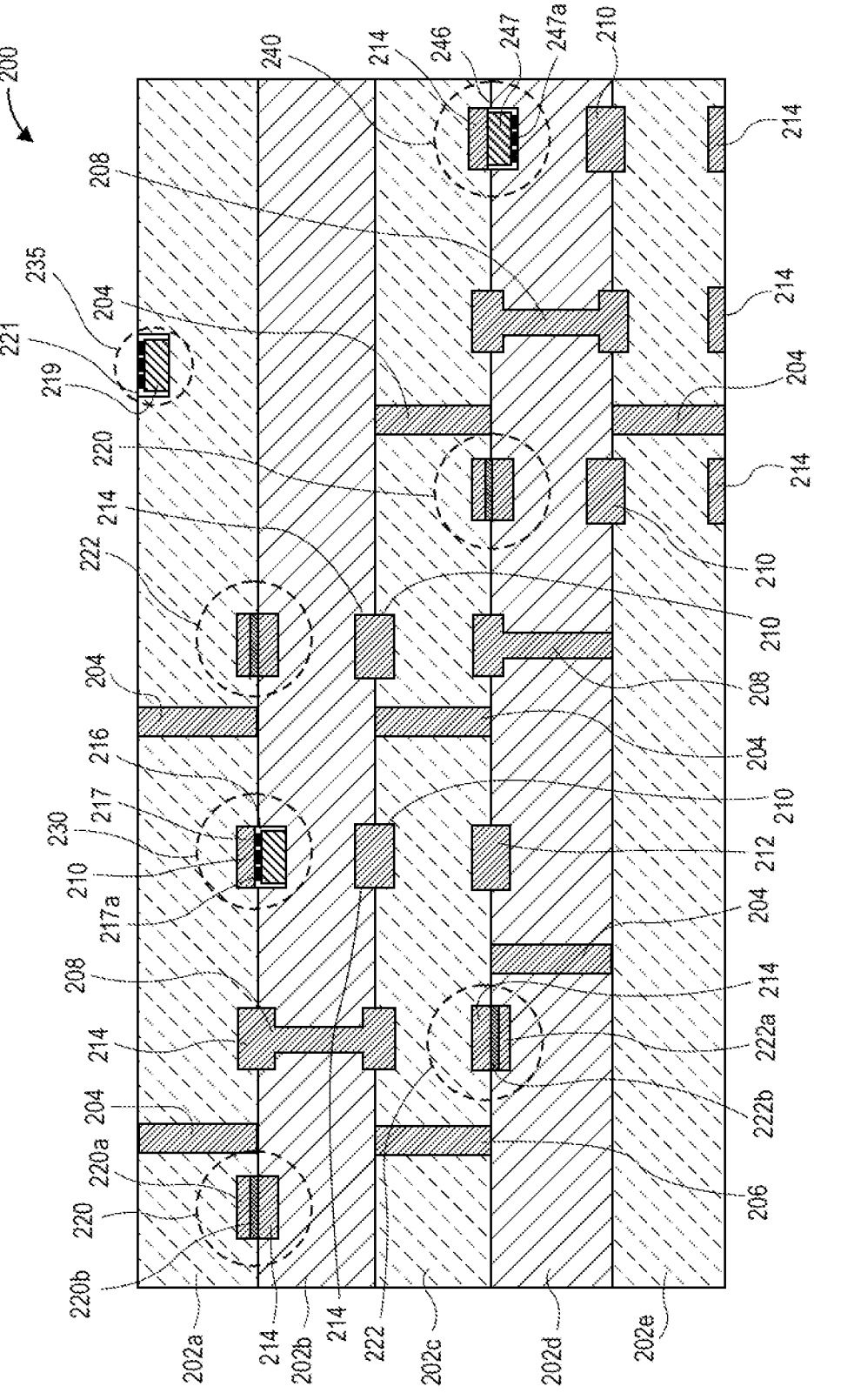
FIG. 2 shows a cross section side view of a package core that includes multiple glass layers that are bonded together and that include a plurality of electrically conductive features, in accordance with various embodiments.

FIG. 2 shows a cross section side view of a package core that includes multiple glass layers that are bonded together and that include a plurality of electrically conductive features, in accordance with various embodiments. Package core 200 shows a plurality of glass layers 202a-202e that are bonded together. In embodiments, this bonding may be performed using hybrid bonding techniques that may involve direct glass to glass bonding and/or metal to metal bonding. In embodiments, some of the bonding techniques may include epoxy bonding. The bonding may occur at either the wafer or the pane level. In embodiments, each of the glass layers 202a-202e may be of a same type or a different type of glass, depending upon a targeted electrical and/or thermal mechanical performance requirement. For example, a first glass layer 202a may have a low dielectric constant, low loss tangent and a low coefficient of thermal expansion (CTE), whereas the other glass layers 202b-202e may have a different combinations of dielectric constant, loss tangent, and/or CTE.

In embodiments, the glass layers 202a-202e may include one or more of the components as described above with respect to FIG. 1, in particular through vias 204, plane 206, plated through vias 208 that include pads, electrical routings 210, 212, and pads 214. These may be similar to through vias 104, plane 106, plated through vias 108 that include pads, electrical routings 110, 112, and pads 114 of FIG. 1.

Package core 200 shows capacitors 220, inductors 222, and active dies 230, 240 that are embedded within cavities, which may be similar to cavity 116 of FIG. 1. Capacitor 220 includes a first conductive element in the form of pad 214 that is at a surface of glass layer 202b, and a dielectric layer 220b on top of a second conductive element 220a that are at a surface of the glass layer 202a. In embodiments, the first conductive element pad 214, dielectric layer 220b and conductive element 220a were separately formed, and the capacitor 220 was formed when the glass layer 202a was bonded with glass layer 202b. Similarly, inductor 222 may be formed by a first conductive element in the form of pad 214 at the surface of glass layer 202c, a magnetic material 222b, and the second conductive element 222a when glass layer 202c is bonded with glass layer 202d.

Embedded active die 230 includes a cavity 216, which may be similar to cavity 116 of FIG. 1, into which an active die 217 is placed. An electrical routing 210 that is at a surface of the glass layer 202a is in electrical contact with the active die 217 by electrically coupling with die contacts 217*a* when glass layer 202*a* is bonded to glass layer 202*b* after the active die 217 is inserted into the cavity 216.

Embedded die 235, which may be similar to embedded active die 230, includes a cavity 221 at a top of the glass layer 202*a*, at a top surface of the glass substrate 200, into which a die 219 is inserted.

Embedded active die 240 includes a cavity 246, which may be similar to cavity 216, into the glass layer 202*d*. An active die 247 is inserted into the cavity 246, with electrical contacts 247*a* of the active die 247 touching an electrical routing layer at the bottom of the cavity 247 (not shown but similar to routing layer 116*a* of FIG. 1). A bottom of the active die 247 may be supported by a pad 214 embedded within glass layer 202*c*.

Integrated electronic components like inductors, capacitors, or sensors may be formed between the glass layers as described herein. Such components may be made out of different materials including magnetic materials and copper conductors for inductors, and high-k dielectric material and conductive electrodes for capacitors. Furthermore, those components may be recessed in one of the glass layers or simultaneously in any two adjacent glass layers. It should be noted that depending upon the properties of a glass layer within the set of glass layers 202*a*-202*e*, portions of a glass layer may be used as a dielectric to form various components, such as a capacitor, by having a top conductive element and a bottom conductive element on either sides of a glass layer. Similarly, portions of the glass layer may be used as a dielectric material to form other electrically active features.

It should be appreciated that components that may be embedded as described herein may include an integrated passive device (IPD). Furthermore, the IPD may be a multilayer metal-insulator metal capacitor built on ceramic or any other semiconductor substrate. In addition, the IPD may include magnetic inductors or a combination of capacitors and inductors.

Figure 3:
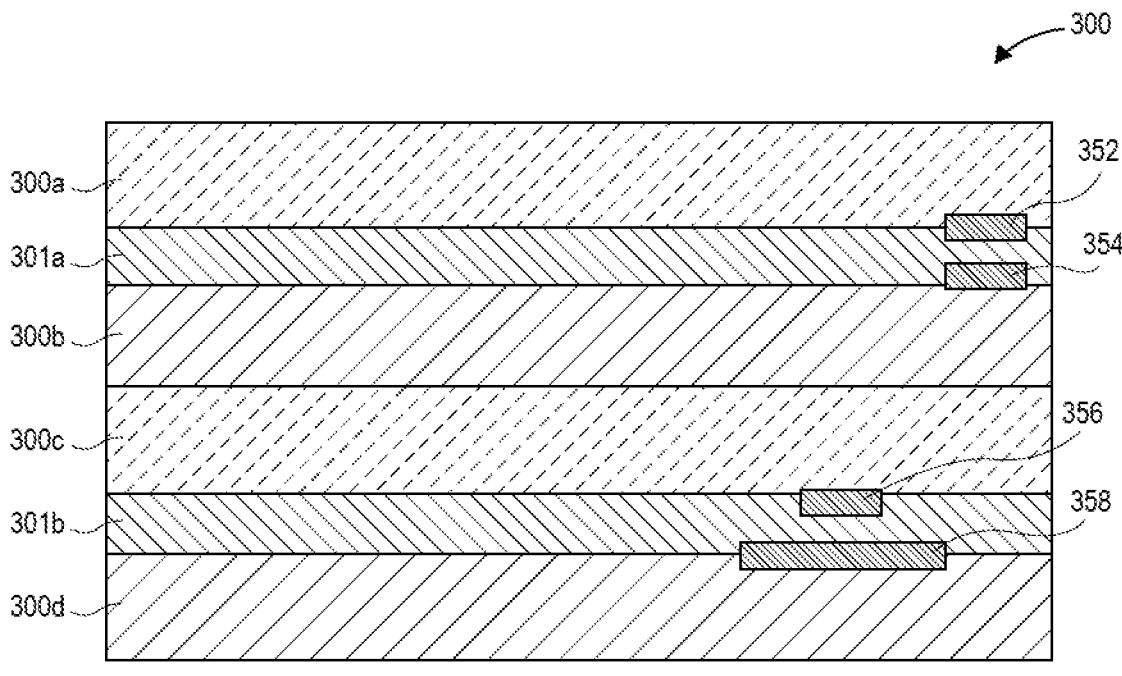
FIG. 3 shows cross section side views of package cores that includes multiple glass layers that are bonded together and that include a dielectric layer between glass layers, in accordance with various embodiments.

FIG. 3 shows cross section side views of package cores that includes multiple glass layers that are bonded together and that include a non-glass layer between glass layers, in accordance with various embodiments. Package core 300, which may be similar to package core 200 of FIG. 2, includes glass layers 300*a*-300*d*, which may be similar to glass layers 200*a* of FIG. 2. As shown, separate interlayers 301*a*, 301*b* may be placed, respectively, between glass layers 300*a*-300*b*, and glass layers 300*c*-300*d*. In embodiments, the interlayers 301*a*, 301*b* are non-glass layers and may be a dielectric material, an adhesive such as an epoxy, or other organic material such as ABF. In embodiments, the layers 300*a*, 301*a*, 300*b*, 300*c*, 301*b*, 300*d* may be hybrid bonded. In embodiments, the interlayers 301*a*, 301*b* may range from 15 μm to 30 μm in thickness.

As shown above with respect to FIG. 3, various routings and vias may be created within the interlayers 301*a*, 301*b* for electrical signaling and/or power delivery. In some embodiments, glass layers 300*a*-300*d* may become too thick to achieve high density routing with high signal integrity. For example having signal routing on one side of a thick glass 300*a* and the reference plane on the other side of the thick glass 300*a* will increase the crosstalk when many traces are placed next to each other. Crosstalk may be avoided by spacing out the routings, therefore leading to low density and low bandwidth density. The the interlayers 301*a*, 301*b* may be used to increase the proximity (or reduce the separation) between a signal and a reference plane.

For example, in embodiments a first signal trace 352 and a second signal trace 354 within interlayer 301*a* may be used to route signals differentially to various areas within glass layer 300*a* and/or glass layer 300*b*. Similarly, a signal trace 356 and a reference/ground trace 358 may be placed within interlayer 301*b*, which provides sufficient separation to maintain the quality of the signal trace 356.

Figure 4:
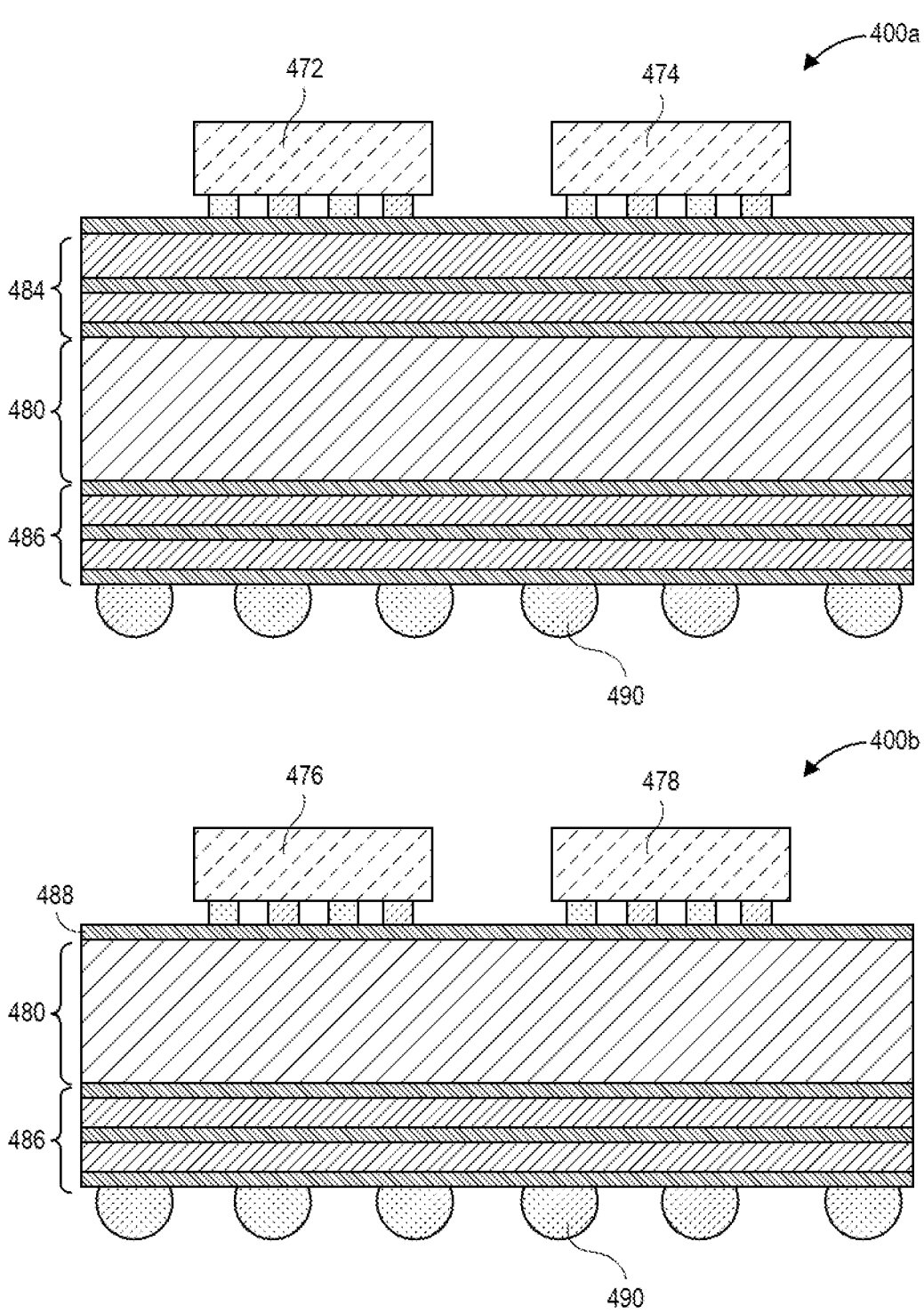
FIG. 4 shows cross section side views of package cores with multiple build-up layers and dies attached to the build-up layers, in accordance with various embodiments.

FIG. 4 shows cross section side views of package cores with multiple build-up layers and dies attached to the build-up layers, in accordance with various embodiments. Package 400*a* includes two dies 472, 474 that are electrically coupled with a first buildup layer 484 that is on top of a glass core stack 480. In embodiments, the glass core stack 480 may be similar to package core 300 of FIG. 3, package core 200 of FIG. 2, and include multiple glass layers such as glass layer 102 of FIG. 1. In embodiments, a second buildup layer 486 at the bottom of the glass core stack 480 may be coupled with one or more interconnects 490, such as solder balls. This is a symmetric stack up, where a number of layers in the first buildup layer 484 is equivalent to the number of layers in the second buildup layer 486.

Package 400*b*, which is similar to package 400*a*, includes two dies 476, 478 that are electrically coupled with a redistribution layer (RDL) 488. The RDL 488 is coupled with the glass core stack 480. A second buildup layer 486 at the bottom of the glass core stack 480 may be coupled with one or more interconnects 490. In embodiments, interconnects 490 may be ball grid arrays, pins, or land grid array pads.

Figure 5:
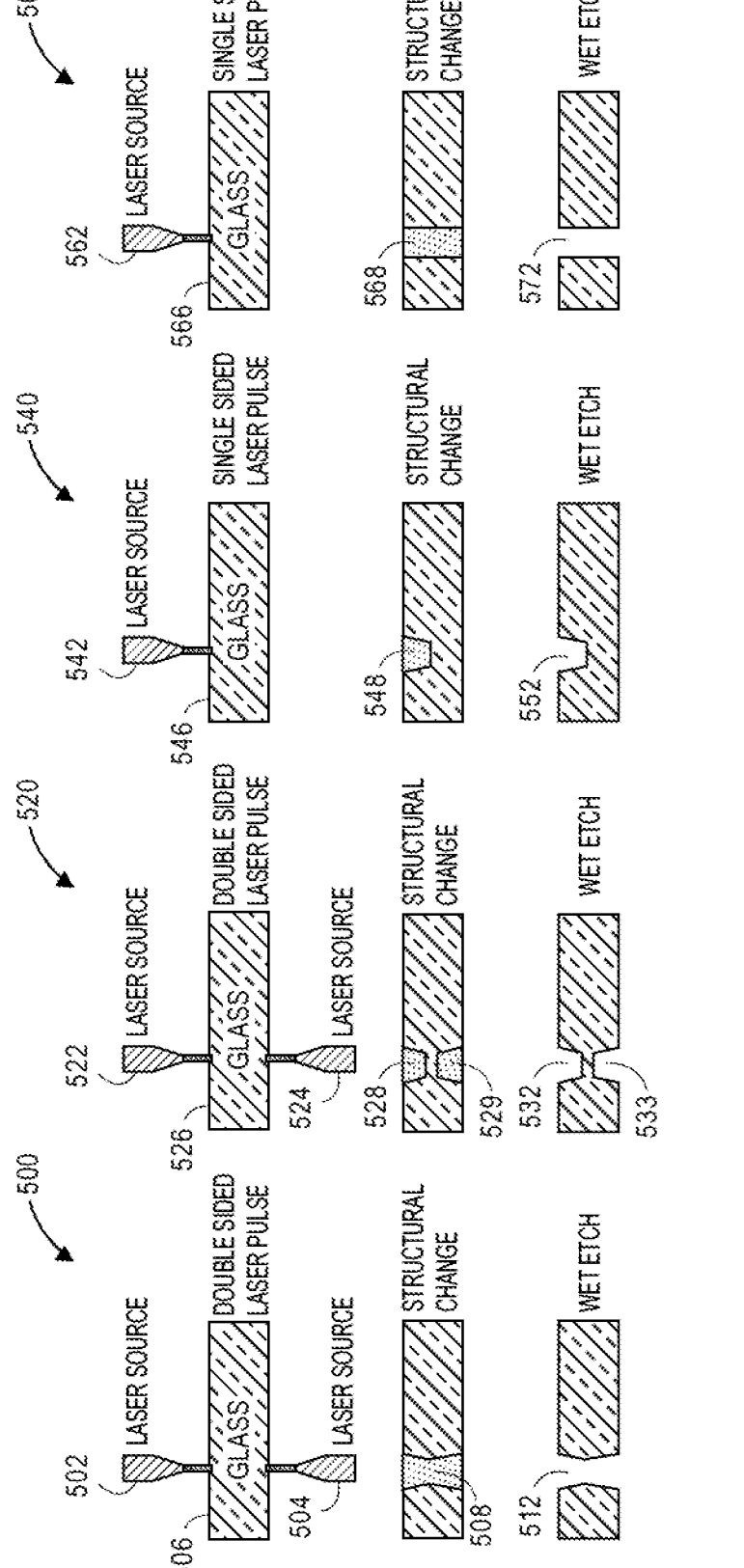
FIG. 5 illustrates multiple examples of laser-assisted etching of glass interconnects processes, in accordance with embodiments.

FIG. 5 illustrates multiple examples of laser-assisted etching of glass interconnects processes (which may be referred to as "LEGIT" herein), in accordance with embodiments. One use of the LEGIT technique is to provide an alternative substrate core material to the legacy copper clad laminate (CCL) core used in semiconductor packages used to implement products such as servers, graphics, clients, 5G, and the like. By using laser-assisted etching, crack free, high density via drills, hollow shapes may be formed into a glass substrate. In embodiments, different process parameters may be adjusted to achieve drills of various shapes and depths, thus opening the door for innovative devices, architectures, processes, and designs in glass. Embodiments, such as the bridge discussed herein, may also take advantage of these techniques.

Diagram 500 shows a high level process flow for a through via and blind via (or trench) in a microelectronic package substrate (e.g. glass) using LEGIT to create a through via or a blind via. A resulting volume/shape of glass with laser-induced morphology change that can then be selectively etched to create a trench, a through hole or a void that can be filled with conductive material. A through via 512 is created by laser pulses from two laser sources 502, 504 on opposite sides of a glass wafer 506. As used herein, a through drill and a through via refers to when the drill or the via starts on one side of the glass/substrate and ends on the other side. A blind drill and a blind via refers to when the drill or the via starts on the surface of the substrate and stops half way inside the substrate. In embodiments, the laser pulses from the two laser sources 502, 504 are applied perpendicularly to the glass wafer 506 to induce a morphological change 508, which may also be referred to as a structural change, in the glass that encounters the laser pulses. This morphological change 508 includes changes in the molecular structure of the glass to make it easier to etch out (remove a portion of the glass). In embodiments, a wet etch process may be used.

Diagram 520 shows a high level process flow for a double blind shape. A double blind shape 532, 533 may be created by laser pulses from two laser sources 522, 524, which may be similar to laser sources 502, 504, that are on opposite sides of the glass wafer 526, which may be similar to glass wafer 506. In this example, adjustments may be made in the laser pulse energy and/or the laser pulse exposure time from the two laser sources 522, 524. As a result, morphological changes 528, 529 in the glass 526 may result, with these changes making it easier to etch out portions of the glass. In embodiments, a wet etch process may be used.

Diagram 540 shows a high level process flow for a single-blind shape, which may also be referred to as a trench. In this example, a single laser source 542 delivers a laser pulse to the glass wafer 546 to create a morphological change 548 in the glass 546. As described above, these morphological changes make it easier to etch out a portion of the glass 552. In embodiments, a wet etch process may be used.

Diagram 560 shows a high level process flow for a through via shape. In this example, a single laser source 562 applies a laser pulse to the glass 566 to create a morpho- logical change 568 in the glass 566, with the change making it easier to etch out a portion of the glass 572. As shown here, the laser pulse energy and/or laser pulse exposure time from the laser source 562 has been adjusted to create an etched out portion 572 that extends entirely through the glass 566.

With respect to FIG. 5, although embodiments show laser sources 502, 504, 522, 524, 542, 562 as perpendicular to a surface of the glass 506, 526, 546, 566, in embodiments, the laser sources may be positioned at an angle to the surface of the glass, with pulse energy and/or pulse exposure time variations in order to cause a diagonal via or a trench, or to shape the via, such as 512, 572, for example to make it cylindrical, tapered, or include some other feature. In addi- tion, varying the glass type may also cause different features within a via or a trench as the etching of glass is strongly dependent on the chemical composition of the glass.

In embodiments using the process described with respect to FIG. 5, through hole vias 512, 572 may be created that are less than 10 μm in diameter, and may have an aspect ratio of 40:1 to 50:1. As a result, a far higher density of vias may be placed within the glass and be placed closer to each other at a fine pitch. In embodiments, this pitch may be 50 μm or less. After creating the vias or trenches, a metallization process may be applied in order to create a conductive pathway through the vias or trenches, for example a plated through hole (PTH). Using these techniques, finer pitch vias will result in better signaling, allowing more I/O signals to be put through the glass wafer and to other coupled com- ponents such as a substrate.

Figure 6:
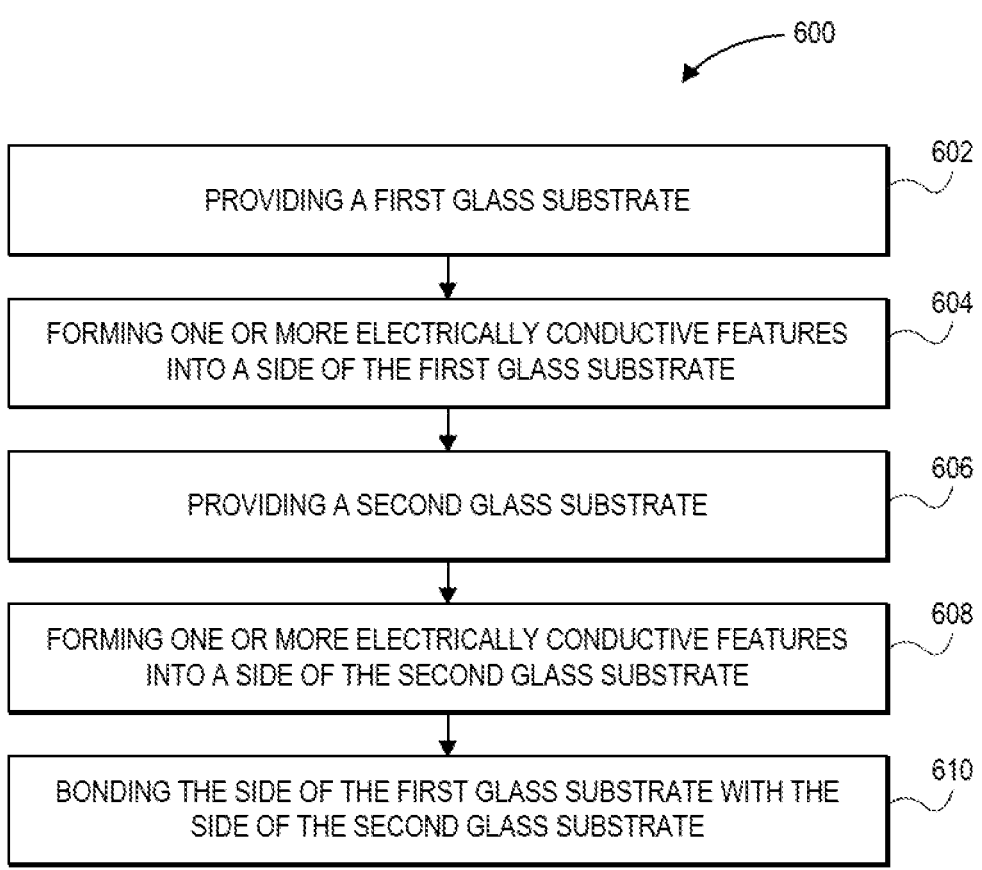
FIG. 6 illustrates an example of a process for creating a multilayer glass core with conductive features, in accordance with various embodiments.

FIG. 6 illustrates an example of a process for creating a multilayer glass core with conductive features, in accor- dance with embodiments. Process 600 may be performed by one or more elements, techniques, or systems that may be described herein, and in particular with respect to FIGS. 1-5.

At block 602, the process may include providing a first glass substrate. In embodiments, the glass substrate may be similar to glass substrate 102 of FIG. 1, or any one of glass substrates 202a-202e of FIG. 2.

At block 604, the process may further include forming one or more electrically conductive features into a side of the first glass substrate. In embodiments, the one or more electrically conductive features may be similar to through vias 104, plane 106, plated through vias 108 that include pads, electrical routings 110, 112, and pads 114 of FIG. 1, through vias 204, plane 206, plated through vias 208 that include pads, electrical routings 210, 212, and pads 214 of FIG. 2.

At block 606, the process may further include providing a second glass substrate. In embodiments, the glass substrate may be similar to glass substrate 102 of FIG. 1, or any one of glass substrates 202a-202e of FIG. 2.

At block 608, the process may further include forming one or more electrically conductive features into a side of the second glass substrate. In embodiments, the one or more electrically conductive features may be similar to through vias 104, plane 106, plated through vias 108 that include pads, electrical routings 110, 112, and pads 114 of FIG. 1, through vias 204, plane 206, plated through vias 208 that include pads, electrical routings 210, 212, and pads 214 of FIG. 2.

At block 610, the process may further include bonding the side of the first glass substrate with the side of the second glass substrate. In embodiments, the bonding may include hybrid bonding or epoxy bonding.

Figure 7:
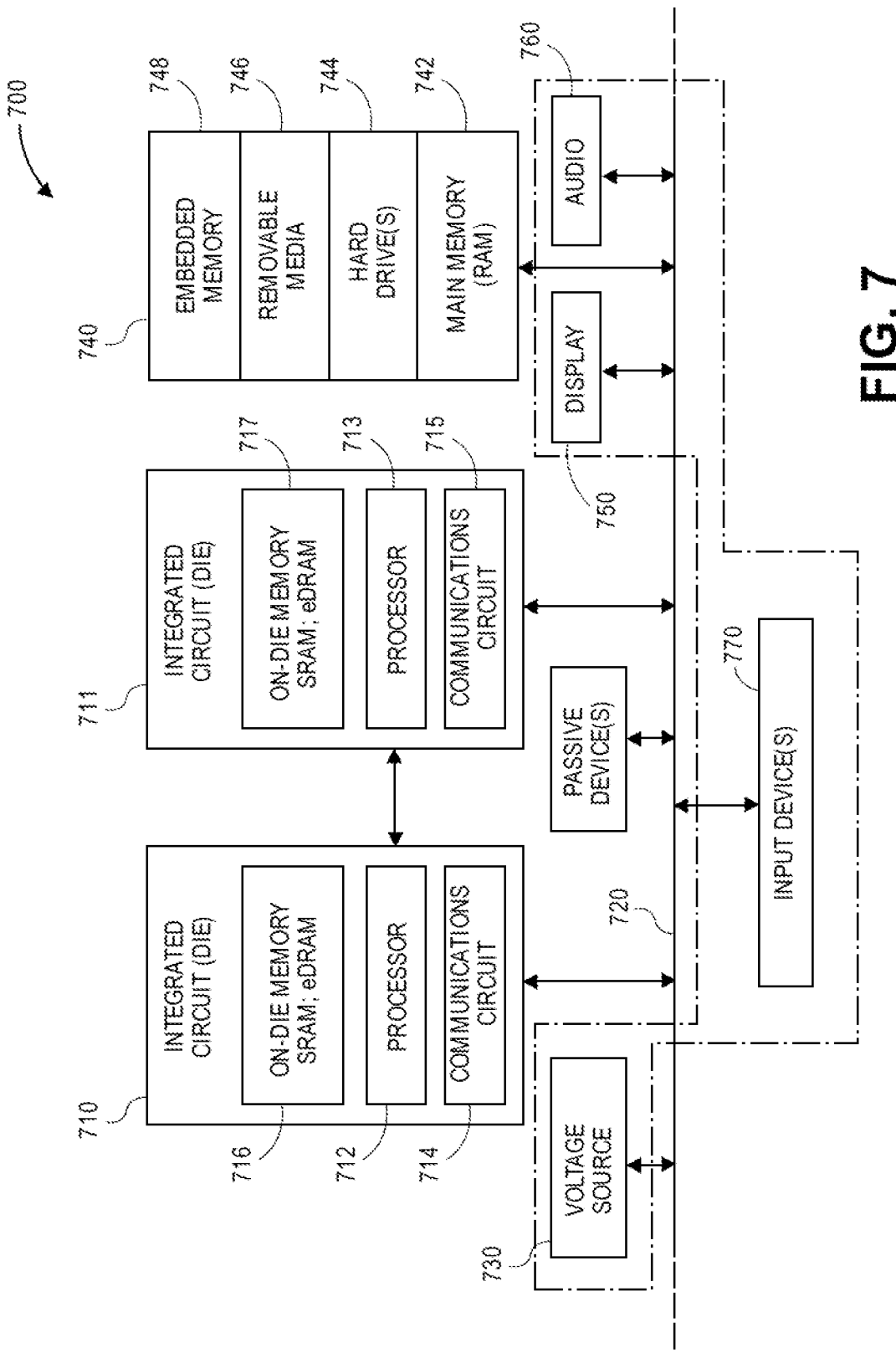
FIG. 7 schematically illustrates a computing device, in accordance with various embodiments.

FIG. 7 is a schematic of a computer system 700, in accordance with an embodiment of the present invention. The computer system 700 (also referred to as the electronic system 700) as depicted can embody a multilayer glass substrate, according to any of the several disclosed embodi- ments and their equivalents as set forth in this disclosure. The computer system 700 may be a mobile device such as a netbook computer. The computer system 700 may be a mobile device such as a wireless smart phone. The computer system 700 may be a desktop computer. The computer system 700 may be a hand-held reader. The computer system 700 may be a server system. The computer system 700 may be a supercomputer or high-performance computing system.

In an embodiment, the electronic system 700 is a com- puter system that includes a system bus 720 to electrically couple the various components of the electronic system 700. The system bus 720 is a single bus or any combination of busses according to various embodiments. The electronic system 700 includes a voltage source 730 that provides power to the integrated circuit 710. In some embodiments, the voltage source 730 supplies current to the integrated circuit 710 through the system bus 720.

The integrated circuit 710 is electrically coupled to the system bus 720 and includes any circuit, or combination of circuits according to an embodiment. In an embodiment, the integrated circuit 710 includes a processor 712 that can be of any type. As used herein, the processor 712 may mean any type of circuit such as, but not limited to, a microprocessor, a microcontroller, a graphics processor, a digital signal processor, or another processor. In an embodiment, the processor 712 includes, or is coupled with, a multilayer glass substrate, as disclosed herein. In an embodiment, SRAM embodiments are found in memory caches of the processor. Other types of circuits that can be included in the integrated circuit 710 are a custom circuit or an application-specific integrated circuit (ASIC), such as a communications circuit 714 for use in wireless devices such as cellular telephones, smart phones, pagers, portable computers, two-way radios, and similar electronic systems, or a communications circuit for servers. In an embodiment, the integrated circuit 710 includes on-die memory 716 such as static random-access memory (SRAM). In an embodiment, the integrated circuit 710 includes embedded on-die memory 716 such as embed- ded dynamic random-access memory (eDRAM).

In an embodiment, the integrated circuit 710 is comple- mented with a subsequent integrated circuit 711. Useful embodiments include a dual processor 713 and a dual communications circuit 715 and dual on-die memory 717 such as SRAM. In an embodiment, the dual integrated circuit 710 includes embedded on-die memory 717 such as eDRAM.

In an embodiment, the electronic system 700 also includes an external memory 740 that in turn may include one or more memory elements suitable to the particular application, such as a main memory 742 in the form of RAM, one or more hard drives 744, and/or one or more drives that handle removable media 746, such as diskettes, compact disks (CDs), digital variable disks (DVDs), flash memory drives, and other removable media known in the art. The external memory 740 may also be embedded memory 748 such as the first die in a die stack, according to an embodiment.

In an embodiment, the electronic system 700 also includes a display device 750, an audio output 760. In an embodiment, the electronic system 700 includes an input device such as a controller 770 that may be a keyboard, mouse, trackball, game controller, microphone, voice-recognition device, or any other input device that inputs information into the electronic system 700. In an embodiment, an input device 770 is a camera. In an embodiment, an input device 770 is a digital sound recorder. In an embodiment, an input device 770 is a camera and a digital sound recorder.

As shown herein, the integrated circuit 710 can be implemented in a number of different embodiments, including a package substrate having a multilayer glass substrate, according to any of the several disclosed embodiments and their equivalents, an electronic system, a computer system, one or more methods of fabricating an integrated circuit, and one or more methods of fabricating an electronic assembly that includes a package substrate having a multilayer glass substrate, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having a multilayer glass substrate embodiments and their equivalents. A foundation substrate may be included, as represented by the dashed line of FIG. 7. Passive devices may also be included, as is also depicted in FIG. 7.

EXAMPLES

The following paragraphs describe examples of various embodiments.

Example 1 is a substrate comprising: a first glass layer, wherein a side of the first glass layer includes one or more electrically conductive features; a second glass layer, wherein a side of the second glass layer includes one or more electrically conductive features; and wherein the side of the first glass layer is coupled with the side of the second glass layer.

Example 2 may include the substrate of example 1, or of any other example or embodiment herein, wherein the one or more electrically conductive features of the first glass layer or the one or more electrically conductive features of the second glass layer include a plurality of electrically conductive vias, wherein a pitch of the plurality of electrically conductive vias ranges from 50 μm to 100 μm.

Example 3 may include the substrate of example 1, or of any other example or embodiment herein, wherein the side of the first glass layer is electrically coupled with the side of the second glass layer.

Example 4 may include the substrate of example 1, or of any other example or embodiment herein, wherein the one or more electrically conductive features include a selected one or more of: a conductive via, a conductive plane, an electrical pad, an electrical trace, a redistribution layer, a capacitor, an inductor, an active die, or a passive die.

Example 5 may include the substrate of example 1, or of any other example or embodiment herein, wherein the side of the first glass layer and the side of the second glass layer are directly coupled.

Example 6 may include the substrate of example 5, or of any other example or embodiment herein, wherein the side of the first glass layer and the side of the second glass layer are hybrid bonded.

Example 7 may include the substrate of example 1, or of any other example or embodiment herein, wherein the side of the first glass layer includes a cavity; and further including an electrical component within the cavity of the first glass layer.

Example 8 may include the substrate of example 7, or of any other example or embodiment herein, wherein the electrical component within the cavity of the first glass layer is electrically coupled with the one or more electrically conductive features of the second glass layer.

Example 9 may include the substrate of example 7, or of any other example or embodiment herein, wherein the electrical component within the cavity of the first glass layer is electrically coupled with a routing layer at a bottom of the cavity.

Example 10 may include the substrate of example 7, or of any other example or embodiment herein, wherein the electrical component is a selected one of: an active component or a passive component.

Example 11 may include the substrate of example 1, or of any other example or embodiment herein, wherein the side of the first glass layer includes a first copper pad with a surface that is substantially parallel to a plane of the side of the first glass layer, wherein the side of the second glass layer includes a second copper pad with a surface that is substantially parallel to the plane of the side of the first glass layer, and wherein the first copper pad and the second copper pad at least partially overlap each other with respect to a direction perpendicular to the plane of the side of the first glass layer; and further comprising a dielectric layer between the first copper pad and the second copper pad, wherein the dielectric layer electrically isolates the first copper pad and the second copper pad from each other.

Example 12 may include the substrate of example 1, or of any other example or embodiment herein, further comprising a dielectric layer between the second side of the first glass layer and the first side of the second glass layer.

Example 13 may include the substrate of example 12, or of any other example or embodiment herein, wherein the dielectric layer includes one or more electrically conductive features that electrically couple the side of the first glass layer with the side of the second glass layer.

Example 14 may include the substrate of example 11, or of any other example or embodiment herein, wherein the dielectric layer includes a capacitor, the capacitor comprising: a first copper pad at a first side of the dielectric layer adjacent to the first glass layer; a second copper pad at a second side of the dielectric layer adjacent to the second glass layer; and wherein the first copper pad, the second copper pad, and a portion of the dielectric layer between the first copper pad and the second copper pad form the capacitor.

Example 15 may include the substrate of example 1, or of any other example or embodiment herein, wherein the one or more electrically conductive features are formed using blind vias in the side of the first glass layer or in the side of the second glass layer.

Example 16 may include the substrate of example 1, or of any other example or embodiment herein, wherein the side of the second glass layer is a first side of the second glass layer; and further comprising a second side of the second glass layer opposite the first side of the second glass layer; a third glass layer wherein a side of the third glass layer includes one or more electrically conductive features; and wherein the side of the third glass layer is electrically and physically coupled with the second side of the second glass layer.

Example 17 is a method comprising: providing a first glass substrate; forming one or more electrically conductive features into a side of the first glass substrate; providing a second glass substrate; forming one or more electrically conductive features into a side of the second glass substrate; and bonding the side of the first glass substrate with the side of the second glass substrate.

Example 18 may include the method of example 17, or of any other example or embodiment herein, wherein bonding the side of the first glass substrate with the side of the second glass substrate includes hybrid bonding.

Example 19 may include the method of example 17, or of any other example or embodiment herein, wherein before the step of providing a second glass substrate, the method further comprising applying a dielectric layer to the side of the first glass substrate.

Example 20 may include the method of example 19, or of any other example or embodiment herein, wherein the dielectric layer includes one or more electrically conductive features that electrically couple the first glass substrate with the second glass substrate.

Example 21 may include the method of example 17, or of any other example or embodiment herein, wherein the side of the second glass substrate is a first side; and further comprising: providing a third glass substrate that includes one or more electrically conductive features into a side of the third glass substrate; and bonding the side of the third glass substrate with the second side of the second glass substrate.

Example 22 is a package comprising: a substrate including: a core that includes a plurality of glass layers; a first buildup layer on a first side of the core; a second buildup layer on a second side of the core opposite the first side of the core; and one or more dies coupled with the first buildup layer.

Example 23 may include the package of example 22, or of any other example or embodiment herein, wherein the plurality of glass layers further includes a plurality of glass layers bonded together, wherein at least one of the plurality of glass layers includes one or more electrically conductive features.

Example 24 may include the package of example 23, or of any other example or embodiment herein, wherein the one or more electrically conductive features include a selected one or more of: a conductive via, a conductive plane, an electrical pad, an electrical trace, a redistribution layer, an active die, or a passive die.

Example 25 may include the package of example 23, or of any other example or embodiment herein, wherein at least two of the plurality of glass layers are separated by a dielectric layer, and wherein a thickness of the dielectric layer ranges from 5 to 15 μm.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. A substrate comprising:
a first glass layer, wherein a first side of the first glass layer includes one or more electrically conductive features;
a second glass layer, wherein a side of the second glass layer includes one or more electrically conductive features;
wherein the first side of the first glass layer is coupled with the side of the second glass layer; and
a third glass layer coupled to a second side of the first glass layer, the second side of the glass layer opposite the first side of the first glass layer, wherein the third glass layer includes one or more electrically conductive features therein; and
a die coupled to the electrically conductive features in the third glass layer.

2. The substrate of claim 1, wherein the one or more electrically conductive features of the first glass layer or the one or more electrically conductive features of the second glass layer include a plurality of electrically conductive vias, wherein a pitch of the plurality of electrically conductive vias ranges from 50 μm to 100 μm.

3. The substrate of claim 1, wherein the first side of the first glass layer is electrically coupled with the side of the second glass layer.

4. The substrate of claim 1, wherein the one or more electrically conductive features include a selected one or more of: a conductive via, a conductive plane, an electrical pad, an electrical trace, a redistribution layer, a capacitor, an inductor, an active die, or a passive die.

5. The substrate of claim 1, wherein the first side of the first glass layer and the side of the second glass layer are directly coupled.

6. The substrate of claim 5, wherein the first side of the first glass layer and the side of the second glass layer are hybrid bonded.

7. The substrate of claim 1, wherein the first side of the first glass layer includes a cavity; and further including an electrical component within the cavity of the first glass layer.

8. The substrate of claim 7, wherein the electrical component within the cavity of the first glass layer is electrically coupled with the one or more electrically conductive features of the second glass layer.

9. The substrate of claim 7, wherein the electrical component within the cavity of the first glass layer is electrically coupled with a routing layer at a bottom of the cavity.

10. The substrate of claim 7, wherein the electrical component is a selected one of: an active component or a passive component.

11. The substrate of claim 1, wherein the first side of the first glass layer includes a first copper pad with a surface that is substantially parallel to a plane of the first side of the first glass layer, wherein the side of the second glass layer includes a second copper pad with a surface that is substantially parallel to the plane of the first side of the first glass layer, and wherein the first copper pad and the second copper pad at least partially overlap each other with respect to a direction perpendicular to the plane of the first side of the first glass layer; and further comprising a dielectric layer between the first copper pad and the second copper pad, wherein the dielectric layer electrically isolates the first copper pad and the second copper pad from each other.

12. The substrate of claim 1, further comprising a dielectric layer between the first side of the first glass layer and the side of the second glass layer.

13. The substrate of claim 12, wherein the dielectric layer includes one or more electrically conductive features that electrically couple the first side of the first glass layer with the side of the second glass layer.

14. The substrate of claim 11, wherein the dielectric layer includes a capacitor, the capacitor comprising:

a first copper pad at a first side of the dielectric layer adjacent to the first glass layer;

a second copper pad at a second side of the dielectric layer adjacent to the second glass layer; and wherein the first copper pad, the second copper pad, and a portion of the dielectric layer between the first copper pad and the second copper pad form the capacitor.

15. The substrate of claim 1, wherein the one or more electrically conductive features are formed using blind vias in the side of the first glass layer or in the side of the second glass layer.

16. The substrate of claim 1, wherein a side of the third glass layer includes one or more electrically conductive features; and wherein the side of the third glass layer is electrically and physically coupled with the second side of the first glass layer.

17. A substrate comprising:

a first glass layer, wherein a first side of the first glass layer includes one or more electrically conductive features;

a second glass layer, wherein a side of the second glass layer includes one or more electrically conductive features;

wherein the first side of the first glass layer is coupled with the side of the second glass layer;

a third glass layer coupled to a second side of the first glass layer, the second side of the glass layer opposite the first side of the first glass layer, wherein the first side of the first glass layer includes a first copper pad with a surface that is substantially parallel to a plane of the first side of the first glass layer, wherein the side of the second glass layer includes a second copper pad with a surface that is substantially parallel to the plane of the first side of the first glass layer, and wherein the first copper pad and the second copper pad at least partially overlap each other with respect to a direction perpendicular to the plane of the first side of the first glass layer; and a dielectric layer between the first copper pad and the second copper pad, wherein the dielectric layer electrically isolates the first copper pad and the second copper pad from each other.

18. The substrate of claim 17, wherein the dielectric layer includes a capacitor, the capacitor comprising:

a first copper pad at a first side of the dielectric layer adjacent to the first glass layer;

a second copper pad at a second side of the dielectric layer adjacent to the second glass layer; and wherein the first copper pad, the second copper pad, and a portion of the dielectric layer between the first copper pad and the second copper pad form the capacitor.

19. A substrate comprising:

a first glass layer, wherein a first side of the first glass layer includes one or more electrically conductive features;

a second glass layer, wherein a side of the second glass layer includes one or more electrically conductive features;

wherein the first side of the first glass layer is coupled with the side of the second glass layer;

a third glass layer coupled to a second side of the first glass layer, the second side of the glass layer opposite the first side of the first glass layer; and a dielectric layer between the first side of the first glass layer and the side of the second glass layer.

20. The substrate of claim 19, wherein the dielectric layer includes one or more electrically conductive features that electrically couple the first side of the first glass layer with the side of the second glass layer.

* * * * *